United States Patent [19]

Waki et al.

[11] Patent Number: 5,182,756
[45] Date of Patent: Jan. 26, 1993

[54] SEMICONDUCTOR LASER DRIVE APPARATUS

[75] Inventors: Michio Waki; Shinzo Takada, both of Tokyo, Japan

[73] Assignee: Kabushiki Kaisha TOPCON, Japan

[21] Appl. No.: 643,112

[22] Filed: Jan. 18, 1991

[30] Foreign Application Priority Data

Jan. 25, 1990 [JP] Japan .................................. 2-13711

[51] Int. Cl.⁵ .............................................. H01S 3/00
[52] U.S. Cl. ...................................... 372/38; 372/26; 372/27; 372/29
[58] Field of Search ..................... 372/38, 26, 29, 24

[56] References Cited

U.S. PATENT DOCUMENTS

| | | | |
|---|---|---|---|
| 3,898,583 | 8/1975 | Shuey | 372/26 |
| 4,009,385 | 2/1977 | Sell | 372/38 |
| 4,539,686 | 9/1985 | Bosch et al. | 572/38 |
| 4,799,224 | 1/1989 | Bottacchi et al. | 372/38 |
| 4,868,836 | 9/1989 | Howard | 372/26 |
| 4,924,470 | 5/1990 | Ries | 372/26 |
| 4,995,105 | 2/1991 | Wechsler | 372/26 |

Primary Examiner—Georgia Y. Epps
Attorney, Agent, or Firm—Ronald P. Kananen

[57] ABSTRACT

A semiconductor laser drive apparatus having a semiconductor laser source (LD) for generating a laser light; a switching means (Q2) for supplying the semiconductor laser source (LD) with a first modulated signal (S2) for driving the semiconductor laser source (LD) on the basis of a second modulated signal (S1); a current source (6) for supplying the switching means (Q2) with a current for producing the first modulated signal (S2) in the switching means (Q2); and a bias adjust means (VR) for adjusting a bias direct-current to be added to the first modulated signal (S2).

20 Claims, 6 Drawing Sheets

SEMICONDUCTOR LASER DRIVE APPARATUS

BACKGROUND OF THE INVENTION

This invention relates to a semiconductor laser drive apparatus.

PRIOR ART

A semiconductor laser is used as a small laser light source of a laser scanner in which a laser light generated from the laser light source can be scanned by the rotation of a polygon mirror. The laser scanner is equipped within an apparatus such as a laser printer or a laser facsimile.

A light modulator operates in such a manner that the laser light is modulated or switched on the basis of a modulated signal. Generally speaking, such a light modulator requires a high-speed driving response and high-stability in operation by low-supply power and also requires that it is compact in size and light in weight, and produced at low cost.

When a semiconductor laser is operated in a high-speed switching condition by a low-speed drive circuit shown in FIG. 7 for the high-speed switching purpose, a light output signal P2 is produced in FIG. 7 based on a modulated signal P1. Referring to FIGS. 8 and 9, the light output signal P2 causes the time delay ts such as a storage time compared to the modulated signal P1. Therefore, although no modulated input signal P1 is applied to the base of a transistor T in the time delay ts, the transistor T is driven into saturation in its collector current, that is, the collector current is reduced to zero when the junction charge in the transistor is equal to zero. The on-off operation of the transistor T is directly performed depending upon the presence or absence of the pulses of the modulated input signal P1. Note that no bias current is supplied to the semiconductor diode LD. The rise time tr, the fall time tf and the delay time td are indicated in FIG. 8. The pulse width t is indicated in FIG. 9 and the pulse width t' in FIG. 10.

The pulse response of the circuit of FIG. 7 is limited because the time delay ts of FIG. 10 affects the on-off switching time of each pulse when a high-frequency modulated input signal P1 is applied to the base of the transistor T. Both the rise time tr and the fall time tf are decreased in value while the time delay ts is increased in value when the large base current is supplied to the transistor to maintain the transistor in saturation. Thus the large base current including noise causes the transistor T to stably operate in an overdriving operation while the collector current is saturated. In this case, it is a disadvantage that the rise time tr and the fall time tf are small while the time delay ts is large. As such a conventional drive circuit is operated in a on-off switching manner, it is a disadvantage that the high-speed response or the high-speed drive is limited by the presence of both the time delay ts and the delay time td. Also, it is a disadvantage that the on-time width of the light output signal P2 is not equal to the off-time width of the light output signal P1 as shown in FIG. 10.

By the way, a differential amplification switching circuit or a differential current switching circuit of FIG. 11 is one of the high-speed modulation drive circuits. Such a complex differential current switching circuit is expensive enough to ensure that two transistors thereof must have identical characteristics.

SUMMARY OF THE INVENTION

The object of this invention is to provide a semiconductor laser drive apparatus which can obtain a high-speed response to perform a high-speed modulation although the semiconductor laser drive apparatus is a simple structure produced at a low cost.

According to this invention, a semiconductor laser diode LD generates a laser light or laser beam. A laser diode switching transistor Q2 supplies the semiconductor laser diode LD with a modulated signal S2 for driving the semiconductor laser diode LD on the basis of a modulated signal S1. A current source or a current supply 6 supplies the laser diode switching transistor Q2 with a current for producing the modulated signal S2 in the switching transistor Q2. A bias adjustor VR adjusts a bias direct-current to be added to the modulated signal S2. Thus, it is possible to improve the response of the laser light modulation as shown in FIG. 3. The suitable laser light modulation in the range from a low frequency to a high frequency can be obtained. The semiconductor laser diode apparatus according to this invention is a simple structure to save production cost thereof.

According to this invention, a modulated light output S3 generated by the semiconductor laser diode LD as a feedback signal is returned to the current source 6 so as to improve the response and the stability of modulation.

Furthermore, according to this invention, a laser diode unit 3 having the semiconductor laser diode LD and the switching transistor Q2 is separated from a laser diode drive unit 5 having the current source 6 and means 7,8. The switching transistor Q2 supplies the semiconductor laser diode LD with the modulated signal S2 for driving the semiconductor laser diode LD on the basis of the modulated signal S1. The impedance of the laser diode switching transistor Q2 in operation is smaller than that of the semiconductor laser diode LD in operation so as to improve the response of the laser diode LD in modulation. The current source 6 supplies the switching transistor Q2 with a current for producing the modulated signal S2 in the switching transistor Q2. The modulated signal S1 is transmitted through the input means 7 and the CR filter 8 to the switching transistor Q2.

DESCRIPTION OF THE PREFERRED EMBODIMENTS

Figure 1:
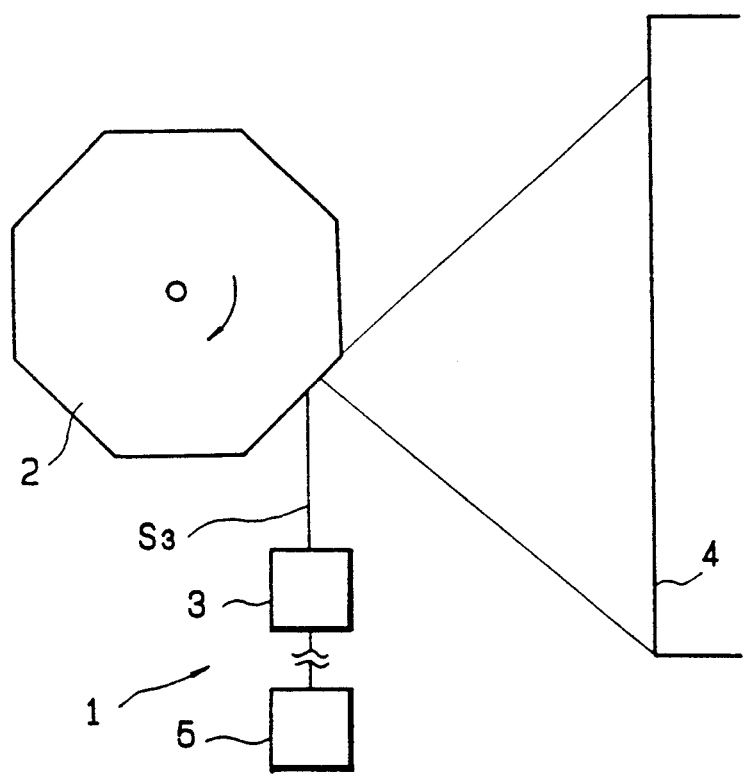
FIG. 1 shows a laser printer with an embodiment of a semiconductor laser drive apparatus according to this invention.

FIG. 1 shows a laser printer with a first embodiment of a semiconductor laser drive apparatus according to this invention. A laser modulated light output S3 from a laser diode unit 3 is applied to a polygon mirror 2 and then is scanned on an object 4 by rotating the polygon mirror 2. The semiconductor laser drive apparatus 1 comprises the laser diode unit 3 and a laser diode drive unit 5.

Figure 2:
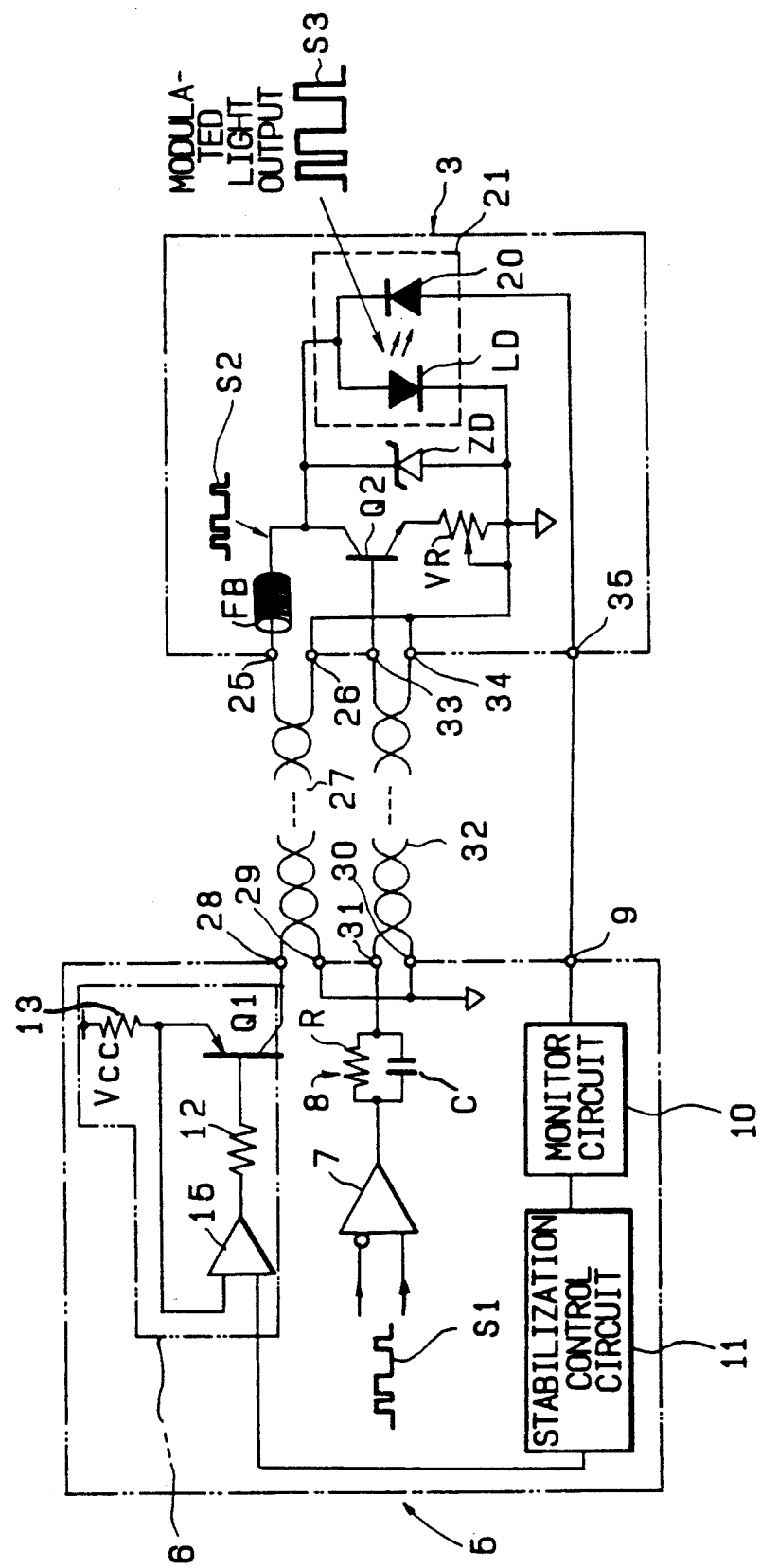
FIG. 2 shows a first embodiment of the semiconductor laser drive apparatus according to this invention.

Referring to FIG. 2, the laser diode drive unit 5 includes a current source 6. An input means 7 for a modulated signal S1 is connected to a CR filter or CR coupling 8. A stabilization control circuit 11 is connected through a monitoring circuit 10 to an input terminal 9 for a monitor signal. The current source 6 has an input means 15, resistors 12, 13 and a transistor Q1. The input means 15 is connected through the resistor 12 to the base of the transistor Q1. A voltage Vcc is applied through the resistor 13 to both the emitter of the transistor Q1 and one of the inputs of the input means 15. A monitor output signal from the stabilization control unit 11 is applied to another input of the input means 15.

A semiconductor laser diode LD is, for example, a GaAs diode. An optical coupling 21 consists of a photodiode 20 and the laser diode LD. When the photodiode 20 receives the modulated light output S3 from the laser diode LD, the output S3 can be transmitted through a terminal 35 and the terminal 9 to the monitor circuit 10 to realize the feedback information for the current supply 6. The laser diode LD is arranged in parallel to a zener diode ZD. The laser diode LD and the zener diode ZD are arranged between the collector and emitter of a laser diode switching transistor Q2 via a bias adjustor VR.

Figure 3:
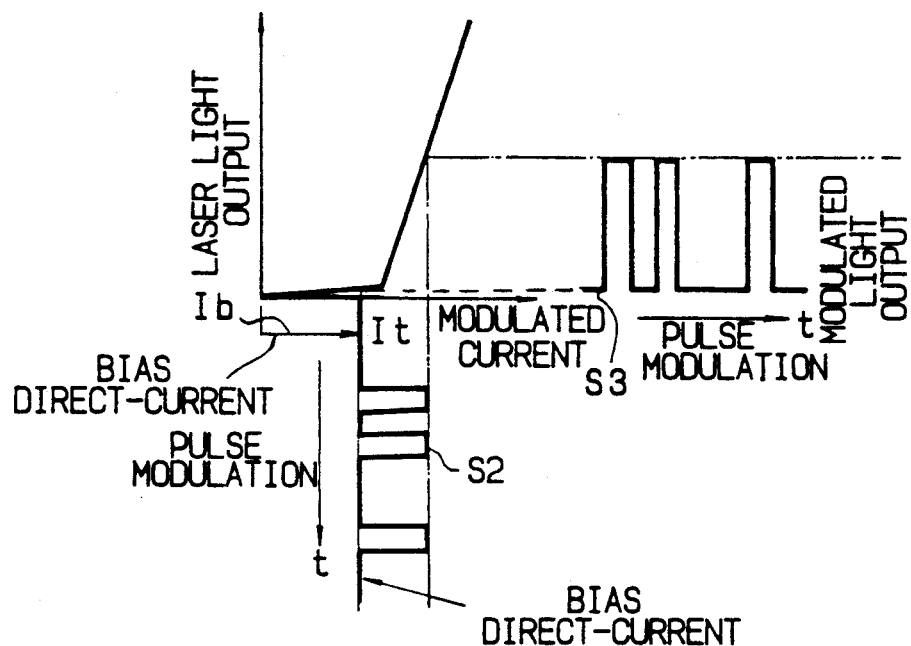
FIG. 3 shows the relation between a modulated light output of a laser diode and a bias direct-current for the laser diode.

The voltage characteristic of the zener diode ZD is slightly larger than the forward voltage of the laser diode LD while the voltage characteristic of the zener diode ZD is set at a low value so as to improve the transient response thereof. The modulated signal S1 is applied to the base of the laser diode switching transistor Q2. The impedance Z1 of the laser diode switching transitor Q2 in operation is much smaller than the impedance Z2 of the laser diode LD in operation so as to obtain the high-speed response of the laser diode LD. The bias adjustor VR is used for adjusting a bias direct-current Ib to be applied to the laser diode LD. FIG. 3 shows an examle of a modulated light characteristic. The bias direct-current Ib is suppied to bias a modulated signal S2 for driving the laser diode LD on the basis of the modulated signal S1. Therefore, the laser diode LD can generate the modulated light output S3 on the basis of the modulated signal S2. The modulated light output S3 is remarkably increased when the biased modulated signal S2 is larger than a threshold current It. By suitable operation of the bias adjustor VR, the switching transistor Q2 can be maintained in an active state although no modulated signal S2 is applied to the laser diode LD. Thus the switching transistor Q2 can quickly respond to the modulated signal S1.

Figure 4:
FIG. 4 shows the reduction of high-frequency noise according to the invention.

Referring to FIG. 2, a twisted pair cable 27 is arranged among an input terminal 25 of the laser diode switching transistor Q2, an input terminal 26 of the bias adjustor VR, an emitter terminal 28 of the transistor Q1, and a terminal 29. The terminal 29 is connected to a terminal 30. A terminal 31 is connected to the CR filter 8. A twisted pair cable 32 is arranged among the terminals 30, 31 and terminals 33, 34. The terminal 33 is directly connected to the base of the laser diode switching transistor Q2. The twisted-pair cables 27, 32 are used to prevent their mutual inductance. The output of the CR filter 8 is directly connected to the base of the laser diode switching transistor Q2 so as to save both the delay time td and the rise time tr of the switching transistor Q2. A ferrite bead FB is arranged near the termisistor Q2. The ferrite bead FB is used to absorb superimposed high-frequency noise on the twisted pair cable 27. Therefore, as shown in FIG. 4, the reduction of the high-frequency noise in the modulated output S2 is performed through the ferrite bead FB. Note that the laser diode unit 3 is separated from the laser diode drive unit 5 by the twisted pair cables 27, 32.

By introducing the modulated signal S1 as a video signal through the input means 7 and the CR filter 8 of the laser diode drive unit 5, high-frequency noise is reduced. The modulated signal S1 having no high-frequency hoise is introduced through the twisted pair cable 32 to the base of the laser diode switching transistor Q2. A current is supplied from the current supply 6 to the laser diode LD by driving the laser diode switching transistor Q2 on the basis of the modulated signal S1. The suitable bias direct-current Ib as in FIG. 3 is added to the modulated signal S2 by operating the bias adjustor VR so as to produce the modulated light output S3 as in FIG. 3. In FIG. 1, the modulated light output S3 can be scanned on the object 4 by the rotation of the polygon mirror 2. The modulated light output S3 from the laser diode LD travels to the photodiode 20 and thus the output of the photodiode 20 is fed through the monitor circuit 10 and the stabilizing control circuit 11 back to the input means 15 of the current source 6. Therefore, the bias direct-current from the current source 6 to the laser diode LD can be regulated to obtain the suitable modulated light output S3 of the laser diode LD.

EMBODIMENT 2

Figure 5:
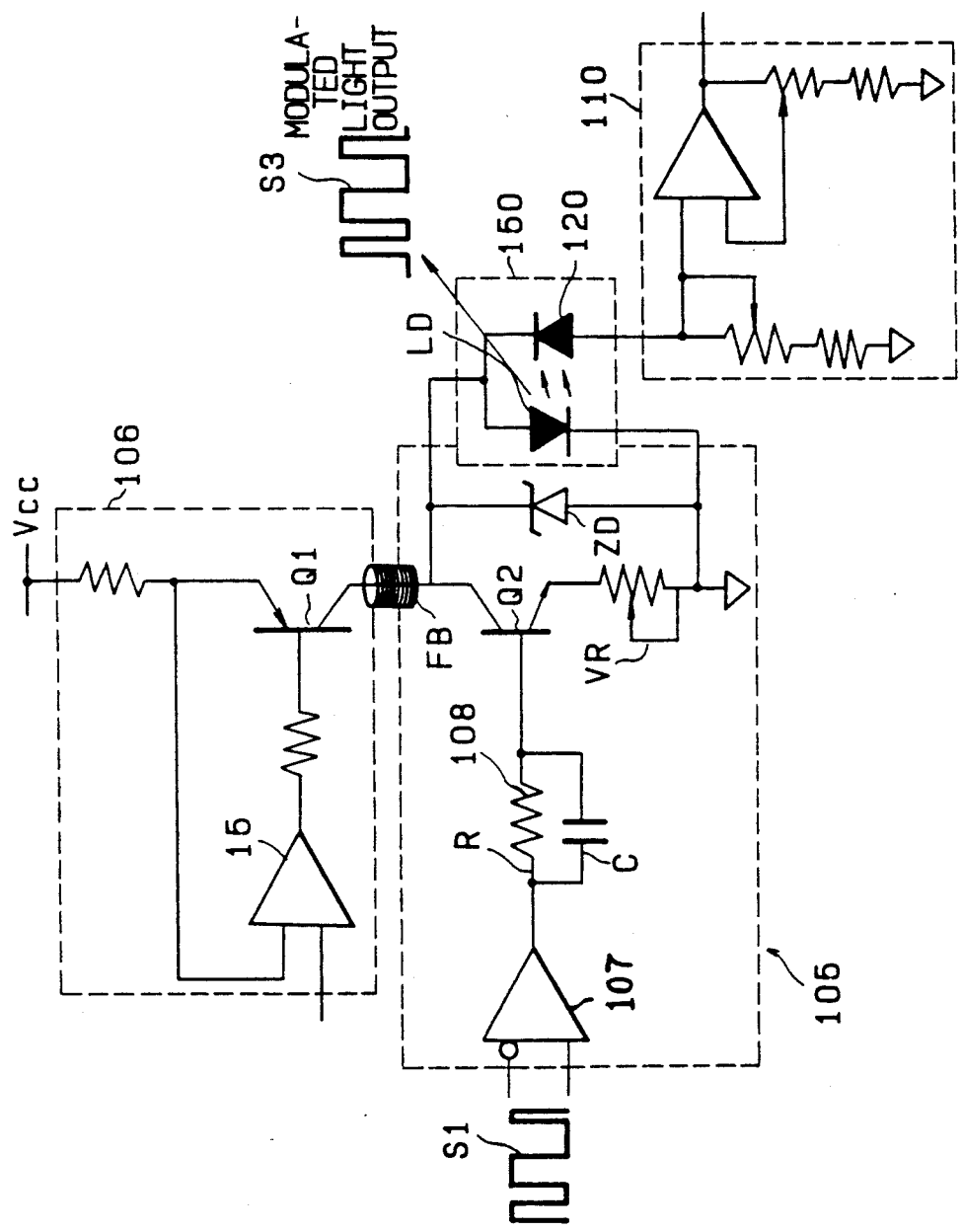
FIG. 5 shows a second embodiment of the semiconductor laser drive apparatus according to this invention.

Referring to FIG. 5, a current source 106 is separated from a laser diode drive unit 105. The laser diode drive unit 105 has a laser diode switching transistor Q2, a zener diode ZD, a bias adjustor VR, a CR filter 108, and an input means 107. The collector of the laser diode switching transistor Q2 is connected to the collector of the transistor Q1 of the current source 106. A ferrite bead FB is arranged between the collector of the switchin,g transistor Q2 and the collector of the transistor Q1. An optically coupled diode circuit 150 incldues the laser diode LD and a phototdiode 120. The optically coupled diode circuit 150 is combined with the laser, diode drive unit 105. A monitor circuit 110 is connected through a stabilization control circuit (not shown) to an input means 15 of the current source 106.

Figure 6:
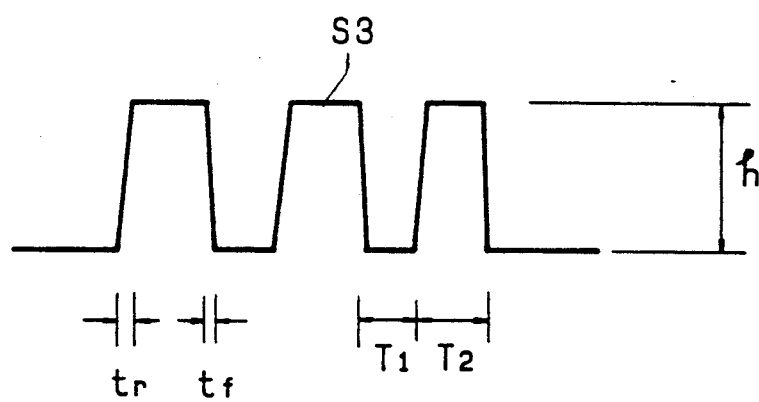
FIG. 6 shows an example of a modulated light output of the laser diode.
Figure 7:
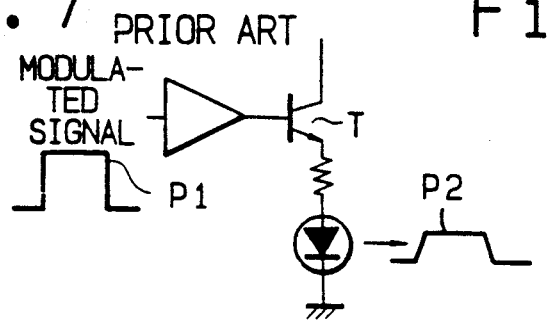
FIG. 7 shows a conventional drive means for a laser diode.
Figure 8:
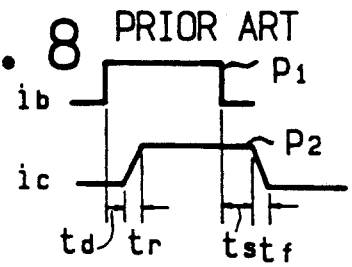
FIG. 8 show a light modulated output signal P2 of the laser diode produced on the basis of a modulated signal P1.
Figure 9:
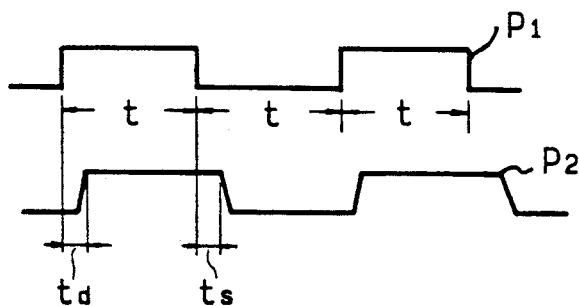
FIG. 9 shows a response of a modulated light output signal P2 in the presence of a low frequency modulated signal P1.
Figure 10:
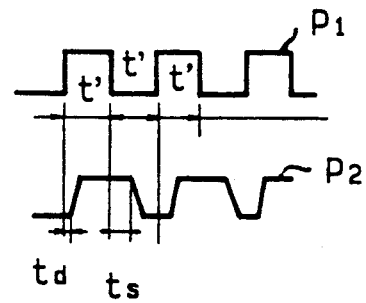
FIG. 10 shows a response of a light modulated output signal P2 in the presence of a high frequency modulated signal P1.
Figure 11:
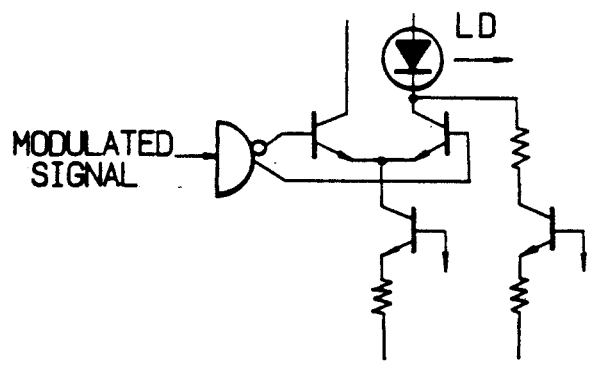
FIG. 11 shows a conventional light-modulation drive means which includes a differentional amplification switching circuit.

By introducing the modulated signal S1 to an input means 107 of the laser diode drive unit 105, a light modulation output S3 is generated from the laser diode LD. The modulated light output S3 is produced by the highspeed-light-modulating operation on the basis of the modulated signal S1 so as to save the rise time tr and the fall time tf of the pulses. For example, as shown in FIG. 6, the minimum pulse width T2 of the modulated light output frequency can be set at 40 MHZ in on-off operation; that is, the modulated light frequency ranges from 0 to 40 MHZ. The rise time and the fall time is equal to 10 ns or less than 10 ns. As shown in FIG. 6, the pulse width T1 and the pulse width T2 can be set at the same intervals so as to save the rise time tr and the fall time tf as mentioned above. Also, the stable modulated light output can be generated on the basis of the suitable pulse duty factor T1/T2. The modulated light output is ranges from 0 to 20 mW. The desired constant peak valve h of the modulated light signal S3 in FIG. 6 within the range of up to 40 MHZ can be obtained. In the embodiments 1 and 2, the transistor Q1 and the switching transistor Q2 may have different characteristics to save the production cost of the semiconductor laser drive apparatus.

This invention is not limited to the mentioned embodiments, for example, it is conceivable that the modulated signal S1 can be directly transmitted to the CR coupling 8 or 108 without the input means 7 or 107.

We claim:

1. A semiconductor laser drive apparatus comprising:
   a semiconductor laser source (LD) for generating a laser light;
   a switching means (Q2) for supplying the semiconductor laser source (LD) with a first modulated signal (S2) for driving the semiconductor laser source (LD) on the basis of a second modulated signal (S1);
   a current source (6) for supplying the switching means (Q2) with a current for producing the first modulated signal (S2) in the switching means (Q2); and
   a base adjusting means (VR) operatively positioned with respect to said switching means and said semiconductor laser source for adjusting a bias direct-current (IB) to be applied to the semiconductor laser source to bias the first modulated signal (S2).

2. A semiconductor laser drive apparatus as claimed in claim 1, further comprising a feedback means (20, 10, 11) for transmitting information of a modulated light output (S3) of the semiconductor source (LD) to the current source (6).

3. A semiconductor laser drive apparatus as claimed in claim 1, wherein the semiconductor laser source (LD) is a semiconductor laser diode.

4. A semiconductor laser drive apparatus as claimed in claim 1, wherein the impedance of the switching means (Q2) in operation is smaller than that of the semiconductor laser source (LD) in operation to realize a high-speed modulation.

5. A semiconductor laser drive apparatus as claimed in claim 1, wherein the switching means (Q2) is a switching transistor.

6. A semiconductor laser drive apparatus as claimed in claim 1, wherein the bias adjusting means (VR) is positioned between the semiconductor laser source (LD) and the switching means (Q2).

7. A semiconductor laser drive apparatus as claimed in claim 6, wherein the bias adjusting means (VR) is a variable resistor.

8. A semiconductor laser drive apparatus as claimed in claim 1, wherein the semiconductor laser source (LD) is driven on the basis of the second modulated signal (S2) biased by the bias current so as to produce a modulated light output (S3).

9. A semiconductor laser drive apparatus as claimed in claim 2, wherein the feedback means includes a photodetector (20), a monitor circuit (10), and a stabilization control circuit (11).

10. A semiconductor laser drive apparatus as claimed in claim 9, wherein the photodetector (20) and the semiconductor laser source (LD) are combined in an optical coupling manner.

11. A semiconductor laser drive apparatus as claimed in claim 5, further comprising a CR filter (8) for reducing a high-frequency noise from the second modulated signal (S1), the CR filter (8) being communicated to the base of the switching transistor.

12. A semiconductor laser drive apparatus as claimed in claim 11, further comprising a first twisted pair cable (32) arranged between the CR filter (8) and the base of the switching transistor.

13. A semiconductor laser drive apparatus as claimed in claim 11, further comprising a second twisted pair cable (27) arranged between the switching transistor and the current source (6).

14. A semiconductor laser drive apparatus as claimed in claim 13, further comprising a ferrite bead (FB) arranged between the second twisted pair cable (27) and the switching transistor (Q2) to reduce high-frequency noise.

15. A semiconductor laser drive apparatus as claimed in claim 1, further comprising a first unit (3) which includes the semiconductor laser source (LD), the switching means (Q2), and the bias adjusting means (VR).

16. A semiconductor laser drive apparatus as claimed in claim 15, further comprising a second unit (5) which includes the current source (6), the CR filter (8), the monitor circuit (10) and the stabilization control circuit (11), the second unit (5) being separated from the first unit (3).

17. A semiconductor laser drive apparatus comprising:
    a semiconductor laser source (LD) for generating a laser light;
    a switching means (Q2) for supplying the semiconductor laser source (LD) with a first modulated signal (S2) for driving the semiconductor laser source (LD) on the basis of a second modulated signal (S1), wherein the impedance of the switching means (Q2) in operation is smaller than that of the semiconductor laser source (LD) in operation;
    a first unit (3) comprising the semicondcutor laser source (LD) and the switching means (Q2);
    a current source (6) for supplying the switching means (Q2) with a current for producing the first modulated signal (S2) in the switching means (Q2);
    a coupling means (7,8) for coupling the switching means (Q2) with the second modulated signal (S1);
    a second unit (5) comprising the current source (6) and the coupling means (7,8); and
    a bias adjusting means (VR) operatively positioned with respect to said switching means and said semiconductor laser source for adjusting a bias direct-current (IB) to be applied to the semiconductor laser source to bias the first modulated signal (S2).

18. A semiconductor laser drive apparatus as claimed in claim 17, wherein the semiconductor laser means (LD) is a semiconductor laser diode.

19. A semiconductor laser drive apparatus as claimed in claim 17, wherein the switching means (Q2) is a switching transistor.

20. A semiconductor laser drive apparatus as claimed in claim 17, wherein the first unit (3) is separated from the second unit (5).

* * * * *